United States Patent
Lee et al.

(10) Patent No.: US 10,276,354 B2
(45) Date of Patent: Apr. 30, 2019

(54) SEGMENTED FOCUS RING ASSEMBLY

(71) Applicant: Applied Materials, Inc., Santa Clara, CA (US)

(72) Inventors: Jared Ahmad Lee, Santa Clara, CA (US); Paul B. Reuter, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 1220 days.

(21) Appl. No.: 14/034,482

(22) Filed: Sep. 23, 2013

(65) Prior Publication Data
US 2014/0110057 A1 Apr. 24, 2014

Related U.S. Application Data

(60) Provisional application No. 61/716,520, filed on Oct. 20, 2012.

(51) Int. Cl.
*C23F 1/08* (2006.01)
*H01J 37/32* (2006.01)

(52) U.S. Cl.
CPC .......... *H01J 37/32642* (2013.01); *C23F 1/08* (2013.01)

(58) Field of Classification Search
CPC . C23F 1/08; H01J 37/32091; H01J 37/32623; H01J 37/32642
See application file for complete search history.

(56) References Cited

U.S. PATENT DOCUMENTS

| | | | | |
|---|---|---|---|---|
| 5,891,348 | A  * | 4/1999 | Ye ........................ | H01J 37/3244 |
| 6,589,352 | B1 * | 7/2003 | Yudovsky ........... | C23C 16/4585 118/500 |
| 7,501,161 | B2 * | 3/2009 | Hou .................... | C23C 16/4585 118/728 |
| 2002/0043337 | A1 * | 4/2002 | Goodman ........... | C23C 16/4581 156/345.12 |
| 2005/0064681 | A1 * | 3/2005 | Wood .................... | G03F 7/0037 438/459 |
| 2005/0082007 | A1 * | 4/2005 | Nguyen ................ | H01J 37/321 156/345.51 |
| 2007/0111339 | A1 * | 5/2007 | Wege ................ | H01J 37/32623 438/10 |
| 2010/0089319 | A1 * | 4/2010 | Sorensen ............ | C23C 16/4585 118/723 E |
| 2010/0116436 | A1 * | 5/2010 | Kitajima ................ | B23P 15/00 156/345.1 |

(Continued)

*Primary Examiner* — Benjamin Kendall
(74) *Attorney, Agent, or Firm* — Patterson + Sheridan LLP

(57) ABSTRACT

Embodiments of the present invention include a focus ring segment and a focus ring assembly. In one embodiment, the focus ring segment includes an arc-shaped body having a lower ring segment, a middle ring segment, a top ring segment and a lip. The lower ring segment has a bottom surface, and the middle ring segment has a bottom surface, wherein the middle ring segment is connected to the lower ring segment at the middle ring segment bottom surface. The top ring segment has a bottom surface, wherein the top ring segment is connected to the middle ring segment at the top ring segment bottom surface. The lip extends horizontally above the middle ring segment, wherein the lip is sloped radially inwards towards a centerline of the focus ring segment. In another embodiment, the focus ring assembly includes at least a first ring segment and a second ring segment.

7 Claims, 5 Drawing Sheets

(56) References Cited

U.S. PATENT DOCUMENTS

| | | | | |
|---|---|---|---|---|
| 2011/0031111 A1* | 2/2011 | Kobayashi | ........ | H01J 37/32623 204/192.34 |
| 2011/0159211 A1* | 6/2011 | Du Bois | ................ | C23C 16/04 427/569 |
| 2011/0180983 A1* | 7/2011 | Arun | ................ | H01J 37/32495 269/86 |
| 2015/0107768 A1* | 4/2015 | Uehara | .................. | C01F 11/22 156/345.1 |

* cited by examiner

SEGMENTED FOCUS RING ASSEMBLY

RELATED APPLICATIONS

This application claim priority to U.S. Patent Application Ser. No. 61/716,520, filed on Oct. 20, 2012, which is incorporated by reference in its entirety.

BACKGROUND OF THE INVENTION

Field of the Invention

Embodiments of the invention generally relate to a segmented focus ring assembly for use in a plasma processing chamber.

Description of the Related Art

Continued evolution of the semiconductor requires smaller and smaller features to be patterned on substrates. As feature size shrinks, manufacturers are challenged to maintain control of device properties and performance. Maintaining control of critical dimensions of features on a semiconductor substrate is a fundamental requirement of etching processes used to form those features. During a plasma etch process, for example, the critical dimension (CD) could be the width of a gate structure, trench or via and the like.

As technology nodes advance and critical dimensions shrink, increasing emphasis is placed on reducing the amount of edge-exclusion on a substrate. Edge-exclusion refers to the area near the edge of a substrate in which no features or devices are formed. Reducing edge-exclusion provides space for forming additional devices nearer the edge of a substrate. As structures are formed closer to the edge, maintaining CD uniformity across the substrate during etching processes becomes more difficult. A common form of CD non-uniformity is known as "edge roll-off," which features a dramatic reduction in CD control close to the edge of the substrate. Additionally, CD bias, the change in CD as successive layers are etched, declines near the edge.

Current plasma etch processes attempt to address this problem by providing a "focus ring" near the edge of the substrate that has similar composition to the substrate. It is thought that the focus ring behaves as an "extension" of the film being etched and promotes a uniform concentration of etch by-product species across the substrate. This, in turn, promotes a more uniform etch rate. However, in certain chamber designs, there is not enough room to accommodate a conventional focus ring.

Thus, there is a need for an alternative for conventional focus ring.

SUMMARY

Embodiments of the invention include a focus ring segment and a segmented focus ring assembly. In one embodiment, the focus ring segment includes an arc-shaped body having a lower ring segment, a middle ring segment, a top ring segment and a lip. The lower ring segment has a bottom surface, and the middle ring segment has a bottom surface, wherein the middle ring segment is connected to the lower ring segment at the middle ring segment bottom surface and extends horizontally above the lower ring segment. The top ring segment has a bottom surface, wherein the top ring segment is connected to the middle ring segment at the top ring segment bottom surface. The lip extends horizontally above the middle ring segment, wherein the lip is sloped radially inwards towards a centerline of the focus ring segment.

In another embodiment, a segmented focus ring assembly includes at least a first ring segment and a second ring segment. Each of the ring segments includes an arc-shaped body having a lower ring segment, a middle ring segment, a top ring segment and a lip. The lower ring segment has a bottom surface, and the middle ring segment has a bottom surface, wherein the middle ring segment is connected to the lower ring segment at the middle ring segment bottom surface and extends horizontally above the lower ring segment. The top ring segment has a bottom surface, wherein the top ring segment is connected to the middle ring segment at the top ring segment bottom surface. The lip extends horizontally above the middle ring segment, wherein the lip is sloped radially inwards towards a centerline of the focus ring segment.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
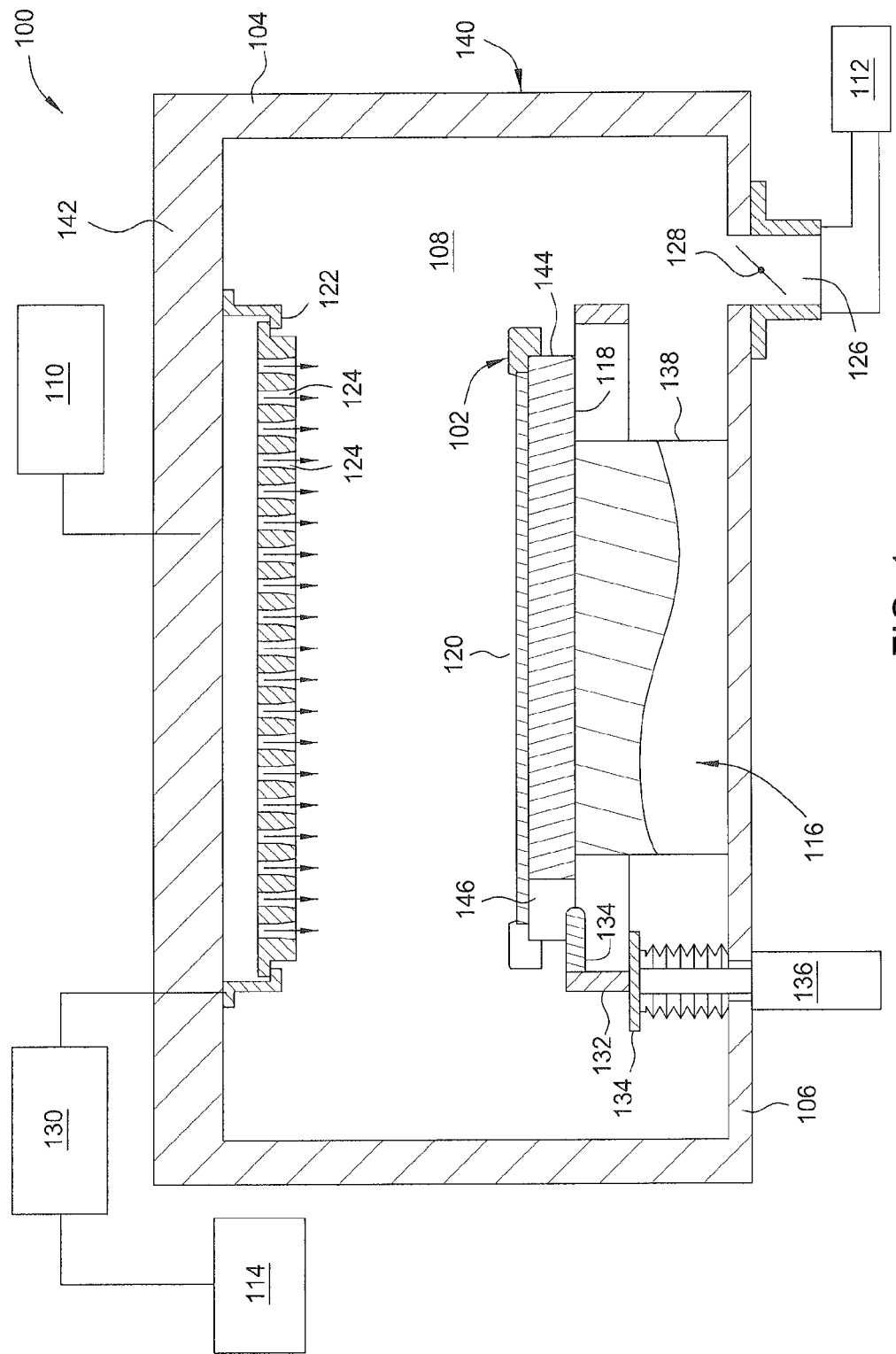
FIG. 1 is a schematic cross-sectional view of a processing chamber having a segmented focus ring according to one embodiment of the invention.

FIG. 1 is a schematic cross-sectional view of a processing chamber 100 having a segmented focus ring assembly 102 according to one embodiment of the invention. The processing chamber 100 has a chamber body 140 comprising sidewalls 104 and a bottom 106. A lid 142 is disposed on the chamber body 140 and encloses a processing volume 108. The processing chamber 100 is coupled to a gas source 110, a vacuum pump 112 and a power source 114.

A substrate support assembly 116 is disposed approximately within the processing volume 108 of the processing chamber 100. The substrate support assembly 116 includes a substrate support 118 disposed on a substrate support pedestal 138. The substrate support pedestal 138 is disposed on the chamber bottom 106. The substrate support 118 supports a substrate 120 during processing.

The focus ring assembly 102 is supported on the substrate support assembly 116 and engages with an edge 144 of the substrate support 118. The focus ring assembly 102 is sized to closely circumscribe the substrate 120 to confine a predefined area in which the substrate 120 is disposed on the substrate support 118 so that the substrate does not slide or move significantly during processing.

In one embodiment the processing chamber 100 includes a lift hoop 132 with a plurality of lifting fingers 134. The lift hoop 132 is coupled to an actuator 136, such as a linear actuator or motor operable to control the vertical elevation of the lift hoop 132 within the processing volume 108. The lifting fingers 134 are configured to transfer substrates between the substrate support assembly 116 and substrate transfer devices, such as robots, when the lift hoop 132 is in transfer position (not shown). The lifting fingers 134 are aligned with cut outs 146 formed in the substrate support assembly 116 to move the substrate 120 between a transfer position above the substrate support assembly 116 and a processing position disposed on the substrate support 118.

A gas inlet such as a nozzle or gas distribution plate (shown in FIG. 1 as a gas distribution plate 122) is utilized to provide process and other gases into the processing volume 108. The gas distribution plate 122 is disposed in the chamber 100 above the substrate support assembly 116. The gas distribution plate 122 may include a plurality of gas passages 124.

In the embodiment depicted in FIG. 1, the gas source 110 provides processing gas that enter the processing volume 108 through the gas distribution plate 122. Processing gas flows through the gas distribution plate 122 toward the substrate support assembly 116, and is evacuated via the vacuum pump 112 through an exhaust port 126 located in the bottom 106 of the processing chamber 100. A throttle valve 128 is disposed in the exhaust port 126 and is used in conjunction with the vacuum pump 112 to control the pressure in the processing volume 108.

In the embodiment depicted in FIG. 1, the gas distribution plate 122 is connected to the power source 114 through a match circuit 130. Power is proved through the match circuit 130 to the gas distribution plate 122 to energize the process and other gases provided in the processing chamber 100 to form and/or sustain plasma therein.

Figure 2:
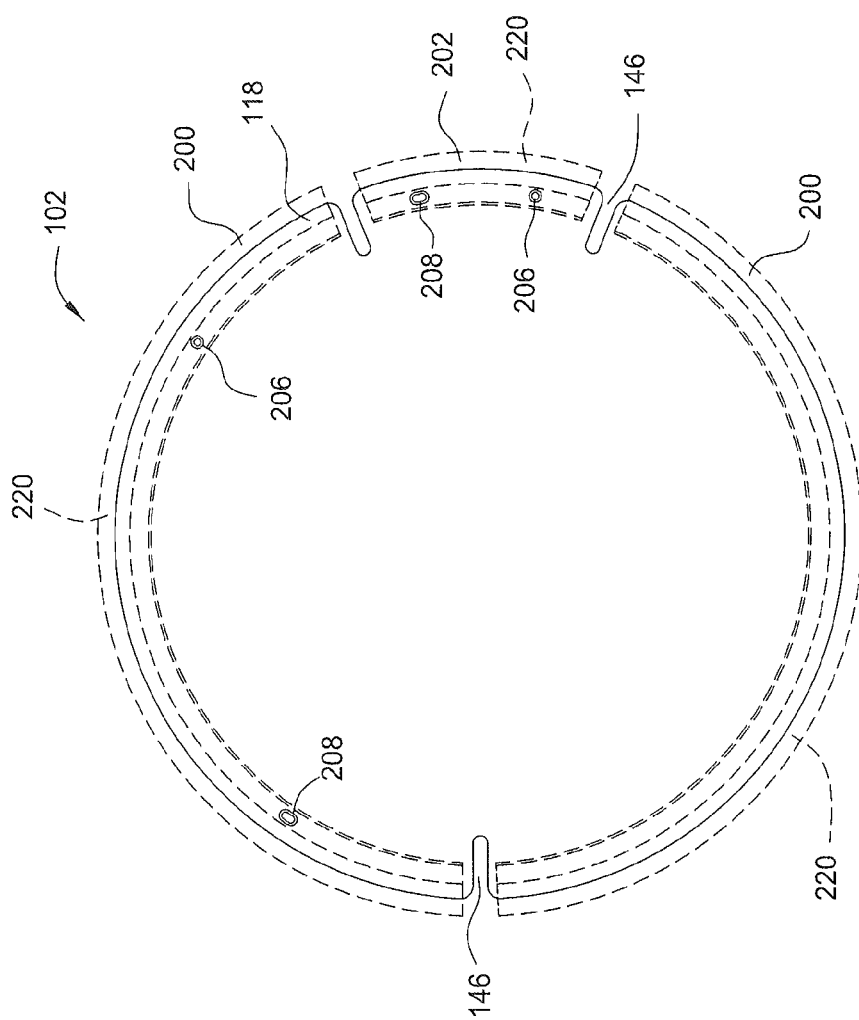
FIG. 2 is a top view of a substrate support of the processing chamber of FIG. 1 illustrating the focus ring assembly in phantom.

FIG. 2 is a top view of the substrate support 118 having the focus ring assembly 102 shown in phantom. In one embodiment, the focus ring assembly 102 has a plurality of ring segments, shown as two large ring segments 200 and one small ring segment 202. The ring segments 200, 202 are spaced to advantageously allow the lifting fingers 134 of the lift hoop 132 to pass through the focus ring assembly 102, thereby allowing the lifting fingers 134 to move the substrate 120 between a processing position (as shown in FIG. 1) and a transfer position spaced above the substrate support 118.

Each ring segment 200, 202 of the focus ring assembly 102 includes an arc-shaped body 220. Each arc-shaped body 220 may be fabricated from aluminum, quartz, or any other suitable material. In the embodiment shown in FIG. 2, the focus ring assembly 102 has two large ring segments 200 and one small ring segment 202.

The ring segments 200, 202 of the focus ring assembly 102 are arranged in a polar array concentric with the centerline of the substrate support 118. The ring segments 200, 202 are arranged to form a ring, wherein adjacent ring segments 200, 202 are spaced to expose a sufficient portion of the cut outs 146 to allow the lifting fingers 134 to pass between the ring segments 200, 202 as the substrate 120 is lifted from and set down upon the substrate support 118.

Figure 3:
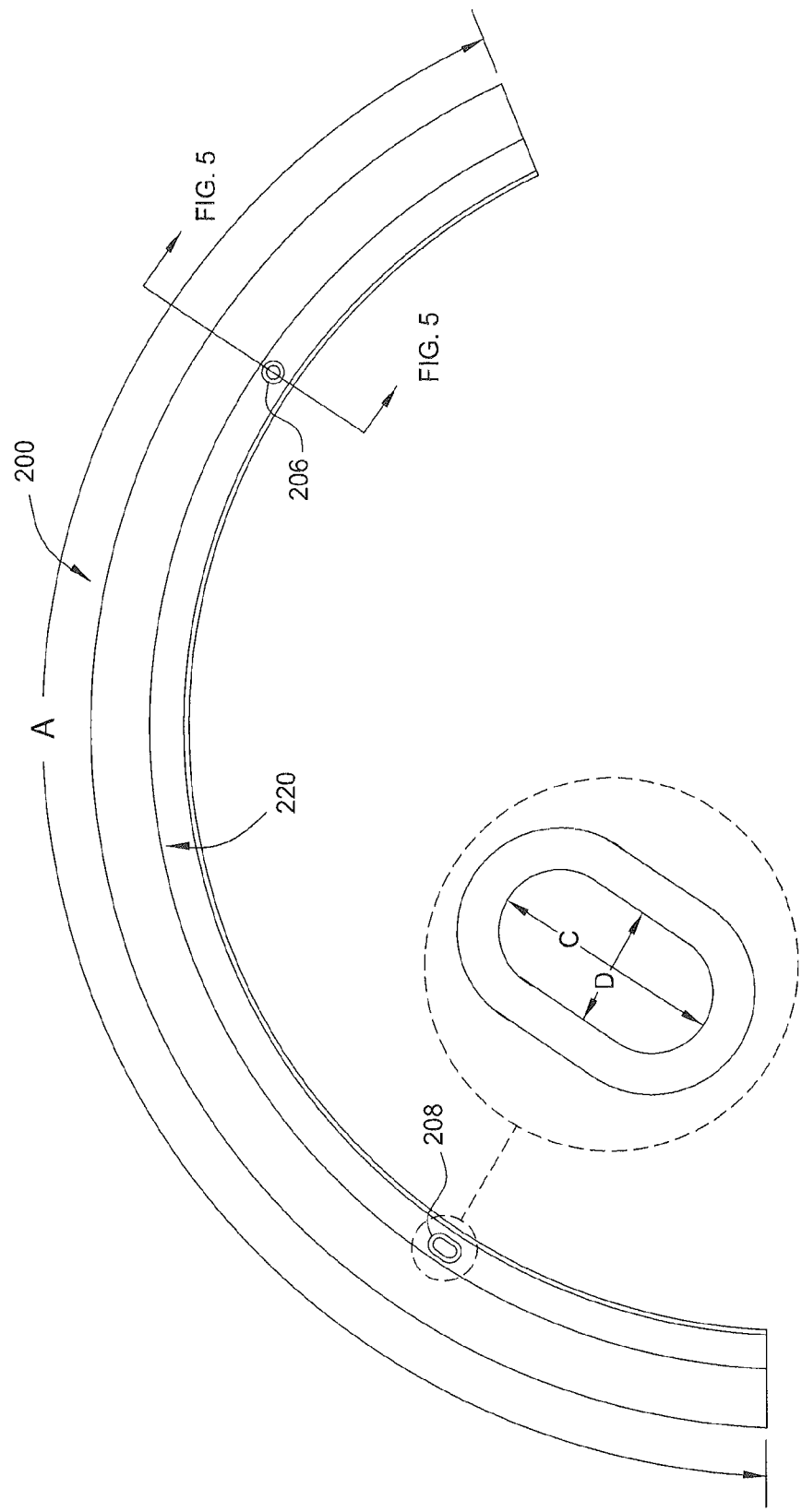
FIG. 3 is a bottom view of a focus ring segment according to one embodiment of the invention.
Figure 4:
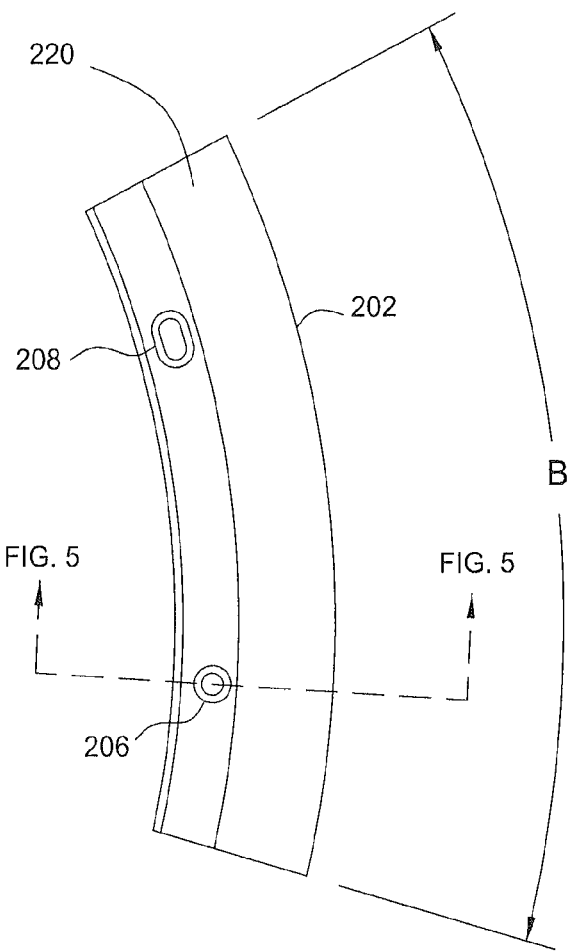
FIG. 4 is a bottom view of a focus ring segment according to another embodiment of the invention.

FIGS. 3 and 4 are bottom views of the large ring segment 200 and the small ring segment 202 according to one embodiment of the invention. In one embodiment, the large ring segment 200 has an arc angle "A" that is between about 153 degrees and about 163 degrees, for example 158 degrees. The small ring segment 202 has an arc "B" that is between about 39 degrees and about 49 degrees, for example 44 degrees. Both the large ring segment 200 and the small ring segment 202 include an aperture 206 and an arc-shaped slot 208 formed in a bottom surface of the body 220, as discussed below with reference to FIG. 5. The aperture 206 and the slot 208 are configured to receive substrate support pins (not shown) extending from the substrate support 118 to align the ring segments 200, 202 of focus ring assembly 102 with the substrate support assembly 116. The slot 208 has a width C that is about double a length of an arc segment D defining the length of the slot 208. In one embodiment, width C is between about 0.26 inches and about 0.28 inches, for example 0.27 inches, and length D is between about 0.13 inches and about 0.15 inches, for example 0.14 inches. The arc of the slot 208 allows the ring segments 200, 202 to expand substantially without loss of concentricity with the substrate support 118 or significant change in an inside diameter.

Figure 5:
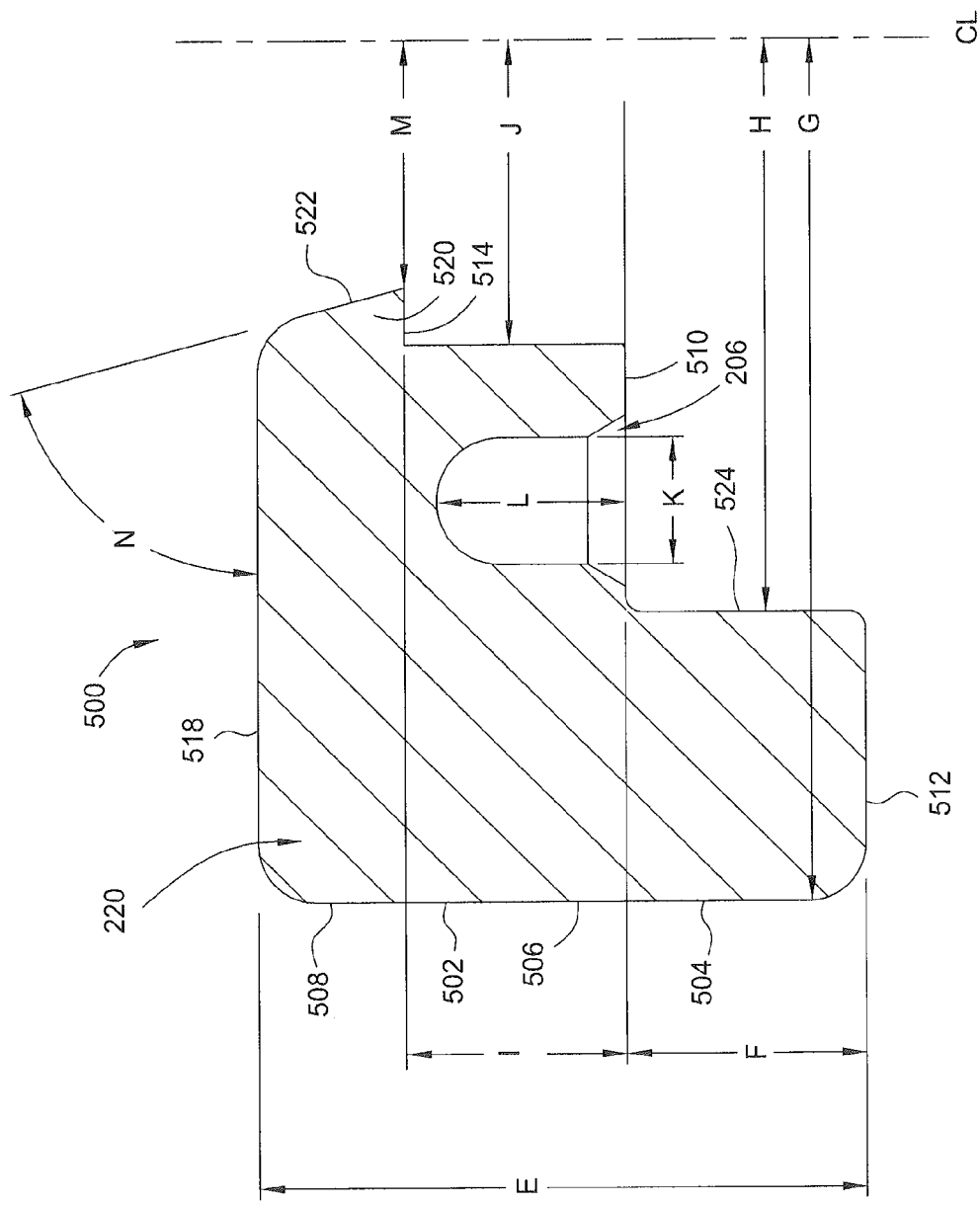
FIG. 5 is a cross-sectional view of a focus ring segment taken along the section line of FIG. 3.

FIG. 5 is a cross-sectional view of the of the focus ring assembly 102 taken along the section line passing through the aperture 206 of either FIG. 3 or FIG. 4. For ease of explanation, reference numeral 500 refers to both the large ring segment 200 and the small ring segment 202, hereinafter segment 500. The body 220 of each segment 500 includes an outer wall 502, a lower ring segment 504, a middle ring segment 506, and a top ring segment 508. The lower ring segment 504, the middle ring segment 506, and the top ring segment 508 are generally stacked in a plane perpendicular to the centerline (CL) of the segment 500, defining the arc of the segment 500 as a single, unitary structure comprising the body 220. The outer wall 502 has a height E between about 0.60 inches and 0.70 inches, for example 0.65 inches. The lower ring segment 504 has a bottom surface 512 and a lower ring segment inner wall 524, wherein the bottom surface 512 also defines the bottom surface of the segment 500. The outer wall 502 meets the bottom surface 512 at a rounded corner having a radius between about 0.01 inches to about 0.11 inches, for example 0.06 inches. The bottom surface 512 meets the lower ring segment inner wall 524 at a rounded corner having a radius between about 0.01 inches and about 0.07 inches, for example 0.02 inches. The lower ring segment 504 has a height F defined between a bottom surface 510 of the middle ring segment 506 and the bottom surface 512 of the lower ring segment 504 of between about 0.21 inches and about 0.31 inches, for example 0.26 inches. The lower ring segment 504 has an outer diameter G of between about 13.70 inches and about 13.80 inches, for example 13.75 inches. In one embodiment, the outer diameter G is also the outer diameter of the segment 500. The lower ring segment 504 has an inner diameter H between about 12.58 inches and about 12.68 inches, for example 12.63 inches.

The middle ring segment 506 has a height I defined between a bottom surface 514 of the top ring segment 508 a bottom surface 510 of the middle ring segment 506 of between about 0.18 inches and about 0.28 inches, for example 0.23 inches. The bottom surface 510 meets the lower ring segment inner wall 524 at a rounded corner having a radius between about 0.01 inches and about 0.07 inches, for example 0.02 inches. The middle ring segment 506 has an inner diameter J of between about 11.91 inches and about 12.01 inches, for example 11.96 inches. The inner diameter J is advantageously smaller than the inner diameter H to allow the bottom surface 510 to be supported by the substrate support assembly 116, while begin relatively close to the substrate 120 to protect the substrate support assembly 116 from the processing environment.

In one embodiment, as shown in FIG. 5, the bottom surface 510 of the middle ring segment 506 has the aperture 206 formed therein. The aperture 206 has a diameter K that has the same dimensions as the diameter D of the slot 208. The aperture 206 has an internal height L of between about 0.15 inches and about 0.25 inches, for example 0.20 inches. Although not shown in FIG. 5, the slot 208 is also formed in the bottom surface 510 of the middle ring segment 506.

The top ring segment 508 has a top surface 518 and a lip 520. The top surface 518 of the top ring segment 508 also defines the top surface of the segment 500. The top ring segment 508 has an inner diameter M of between about 11.79 inches and about 11.89 inches, for example 11.84 inches. The lip 520 extends horizontally inward of the middle ring segment 506 towards the center line of the segment 500. The lip 520 has a sloped inner surface 522 that extends radially inwards and downward away from the top surface 518 towards the center line of the segment 500, and intersects the bottom surface 514 of the top ring segment 508.

The sloped inner surface 522 meets the top surface 518 at a rounded corner having a radius between about 0.01 inches and about 0.11 inches, for example 0.06 inches. The outer wall 502 meets the top surface 518 at a rounded corner having a radius between about 0.01 inches and about 0.11 inches, for example 0.06 inches. The sloped inner surface 522 has an angle N defined with the top surface 518 of about 70 degrees and about 80 degrees, for example 75 degrees. The sloped inner surface 522 allows substrates that may be slightly misaligned with substrate support 118 to be guided to a position advantageously more concentric with the substrate support 118. An area inward of the lip 520 corresponding with the inner diameter M beneficially forms a substrate receiving pocket that closely fits around the substrate 120. In one embodiment, the substrate receiving pocket is configured to enhance temperature uniformity by preventing the substrate 120 from becoming substantially misaligned with the center of the substrate support assembly 116. Additionally, the inner diameter M is advantageously selected to provide a substantially tight fit with the substrate 120, thereby improving processing uniformity results while minimizing the area of the substrate support 118 exposed to the processing environment.

Since the uniformity of the dimensions between each of the segments 200, 202 (i.e., the diameters of each segment) is important to enhance both the uniform positioning of the substrate 120 on the surface of substrate support 118 and plasma uniformity above the substrate 120, the segments 200, 202 may be fabricated from a single ring which is cut into appropriately sized segments. This ensures segment to segment dimension uniformity which is not achievable if each segment 200, 202 were individually fabricated.

While the foregoing is directed to embodiments of the present invention, other and further embodiments of the invention thus may be devised without departing from the basic scope thereof, and the scope thereof is determined by the claims that follow.

The invention claimed is:

1. A focus ring segment comprising:
an arc-shaped body comprising:
a lower ring segment having a bottom surface;
a middle ring segment having a bottom surface, wherein the middle ring segment has an arc-shaped slot in the bottom surface inward from a first end, the middle ring segment has an aperture in the bottom surface inward from a second end, the arc-shaped slot having a bottom and two arc-shaped sidewalls, wherein the arc-shaped slot has a length of the arc-shaped slot that is longer than a width of the arc-shaped slot, each of the two arc-shaped sidewalls lie in a radii defined from a centerline of the arc-shaped body, the length of the arc-shaped slot extends along a circumferential direction of the arc-shaped body, the aperture and the arc-shaped slot share a common radius relative to the centerline of the arc-shaped body and configured to allow thermal expansion of the arc-shaped body without significant change in an inside diameter of the arc-shaped body as measured from the centerline to the arc-shaped body, wherein the centerline is defined by the arc of the inside diameter of the middle ring segment of the arc-shaped body, the middle ring segment is connected to the lower ring segment at the bottom surface of the middle ring segment, and the middle ring segment and the bottom surface of the middle ring segment extend horizontally above the lower ring segment;
a top ring segment having a bottom surface, wherein the top ring segment is connected to the middle ring segment at the bottom surface of the top ring segment; and
a lip extending horizontally above the middle ring segment, wherein the lip is sloped radially inwards towards a centerline of the focus ring segment.

2. The focus ring segment of claim 1, wherein the focus ring segment has an outer wall having a height of about 0.65 inches.

3. The focus ring segment of claim 1, wherein the lower ring segment has an outer diameter of about 13.75 inches.

4. The focus ring segment of claim 3, wherein the lower ring segment has an inner diameter of about 12.63 inches.

5. The focus ring segment of claim 1, wherein the middle ring segment has a height of about 0.23 inches.

6. The focus ring segment of claim 1, wherein the middle ring segment has an inner diameter of about 11.96 inches.

7. A focus ring segment, comprising:
an arc-shaped body comprising:
a segment having a bottom surface, wherein the segment has an arc-shaped slot in the bottom surface inward from a first end, the segment has an aperture in the bottom surface inward from a second end, the arc-shaped slot having a bottom and two arc-shaped sidewalls, the length of the arc-shaped slot extends along a circumferential direction of the arc-shaped body, the aperture and the arc-shaped slot share a common radius relative to a centerline of the arc-shaped body and configured to allow thermal expansion of the arc-shaped body without significant change in an inside diameter of the arc-shaped body as measured from the centerline to the arc-shaped body, wherein the centerline is defined by the arc of the inside diameter of the segment of the arc-shaped body.

* * * * *